United States Patent
Gemma

(10) Patent No.: US 11,385,703 B2
(45) Date of Patent: Jul. 12, 2022

(54) SEMICONDUCTOR DEVICE AND SEMICONDUCTOR SYSTEM

(71) Applicant: RENESAS ELECTRONICS CORPORATION, Tokyo (JP)

(72) Inventor: Kazuaki Gemma, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 193 days.

(21) Appl. No.: 16/737,536

(22) Filed: Jan. 8, 2020

(65) Prior Publication Data

US 2020/0233478 A1 Jul. 23, 2020

(30) Foreign Application Priority Data

Jan. 23, 2019 (JP) .............................. JP2019-009173

(51) Int. Cl.
*G06F 1/324* (2019.01)
*G06F 1/3234* (2019.01)
*G11C 5/14* (2006.01)

(52) U.S. Cl.
CPC ............ *G06F 1/324* (2013.01); *G06F 1/3275* (2013.01); *G11C 5/14* (2013.01)

(58) Field of Classification Search
CPC ........ G06F 1/263; G06F 1/3212; G06F 1/324; G06F 1/3275; G11C 17/18; G11C 2207/2227; G11C 5/14; G11C 5/141; G11C 5/143; G11C 5/148; Y02D 10/00

See application file for complete search history.

(56) References Cited

U.S. PATENT DOCUMENTS

| 7,996,698 | B2 * | 8/2011 | Nguyen | G06F 11/30 713/340 |
| 10,410,202 | B1 * | 9/2019 | Ng | G06F 1/08 |
| 2001/0048319 | A1 * | 12/2001 | Miyazaki | H03K 19/00384 326/1 |
| 2003/0206049 | A1 | 11/2003 | Mizuno et al. | |
| 2007/0220281 | A1 * | 9/2007 | Schaver | G06F 1/3203 713/300 |
| 2014/0115313 | A1 * | 4/2014 | Chen | G06F 9/4401 713/2 |

FOREIGN PATENT DOCUMENTS

JP 2007-259463 A 10/2007

* cited by examiner

*Primary Examiner* — Jaweed A Abbaszadeh
*Assistant Examiner* — Brian J Corcoran
(74) *Attorney, Agent, or Firm* — McDermott Will & Emery LLP

(57) ABSTRACT

A semiconductor device selects one start sequence of the normal start and the low-power-consumption start based on the determination result of the determination circuit. According to the configuration, the operation in the start sequence from the power supply input to the processor operation start can be selected from the operation in which the instantaneous current is suppressed and the high-speed operation based on the supplied power supply.

10 Claims, 13 Drawing Sheets

SEMICONDUCTOR DEVICE AND SEMICONDUCTOR SYSTEM

CROSS-REFERENCE TO RELATED APPLICATIONS

The disclosure of Japanese Patent Application No. 2019-009173 filed on Jan. 23, 2019 including the specification, drawings and abstract is incorporated herein by reference in its entirety.

BACKGROUND

The present disclosure relates to a semiconductor device, and more particularly, the present disclosure is applicable to a semiconductor integrated circuit device such as a microcontroller capable of switching a start sequence depending on a type of power supply.

When all the power supplies are turned off to start the semiconductor device, the semiconductor device is shifted to the normal operation mode through the start sequence when the resetting is released. There are disclosed techniques listed below.

In the case of shifting from the normal operation mode to the operation state in which power consumption is reduced, according to Japanese Unexamined Patent Application Publication No. 2007-259463, a transition from the normal operation mode to the low power consumption mode is made by an instruction executed by a processor (CPU) or the like.

The start sequence from when the power supply is off to normal operation is generally determined for each microcontroller.

Depending on the application, the microcontroller with suppressed instantaneous current and the microcontroller with emphasis on performance are selected.

On the other hand, in some cases, a power supply which does not have a sufficient current supply capability, such as a solar cell, a vibrating generator, or the like, is combined with a power supply which has a sufficient current supply capability.

SUMMARY

Semiconductor systems that combine power supply that do not have adequate current-supplying capabilities, such as solar-cell cells and vibration generators, require that the instantaneous current of the mounted microcontrollers be suppressed. Controlling the instantaneous current of the microcontroller is a trade-off with shortening the start time of the microcontroller. In other words, in a semiconductor system having a microcontroller in which instantaneous current is suppressed, there is a problem that a microcontroller in which instantaneous current is suppressed cannot perform high-speed start even when a power supply not having sufficient current supply capability is changed to a power supply having sufficient current supply capability.

If a performance-oriented microcontroller is mounted on a semiconductor system in which a power supply having insufficient current supply capability is combined, the current consumption of the microcontroller may become larger than the current consumption of the power supply in the start sequence from the start of the supply of the power supply to the start of the processor or the like, and in the process from the transition to the low power consumption mode through the normal operation mode.

If the current consumed by the microcontroller exceeds the current supplied by the power supply, a stable start of the microcontroller and continuation of the operation of the microcontroller are not possible.

In semiconductor systems that combine power supply that do not have adequate current supplying capability, a microcontroller that suppresses instantaneous current may be selected and mounted instead of a microcontroller that emphasizes performance. However, suppressing the instantaneous power provides stable start operation of the microcontroller, but generally increases the start time of the microcontroller to reduce the performance of the microcontroller.

In a semiconductor system including a microcontroller in which instantaneous current is suppressed, the current consumed by the microcontroller is suppressed until the semiconductor system shifts to an operation state in which performance is emphasized by an instruction executed by a processor or the like incorporated in the microcontroller from the starting of supplying the power supply.

When the power supply of the semiconductor system on which the microcontroller having the suppressed instantaneous current is mounted is replaced or switched from a power supply having no sufficient current supply capability to a power supply having a sufficient current supply capability, the semiconductor system can have a current supply capability of operating at high speed rather than suppressing the instantaneous current. However, in the period from the time when the power supply is supplied to the time when the operation state is shifted to the time when the performance is emphasized through the start sequence, the operation is performed while the instantaneous current is suppressed. This means that the start sequence times are extended.

It is an object of the present disclosure to provide a semiconductor device capable of switching a start sequence from a power supply input to an operation start of a processor based on a supplied power supply.

Other objects and novel features will become apparent from the description of this specification and the accompanying drawings.

An outline of representative ones of the present disclosure will be briefly described below.

That is, the semiconductor device includes an external terminal, a determination circuit connected to the external terminal for determining voltages of the external terminal, a power control circuit, a clock control circuit, a central processing unit (CPU), and a non-volatile memory. The semiconductor device selects one start sequence of the normal start and the low-power-consumption start based on the determination result of the determination circuit.

According to the above semiconductor device, the operation in the start sequence from the power supply input to the processor operation start can be selected from the operation in which the instantaneous current is suppressed and the high-speed operation based on the supplied power supply.

DETAILED DESCRIPTION

Figure 1:
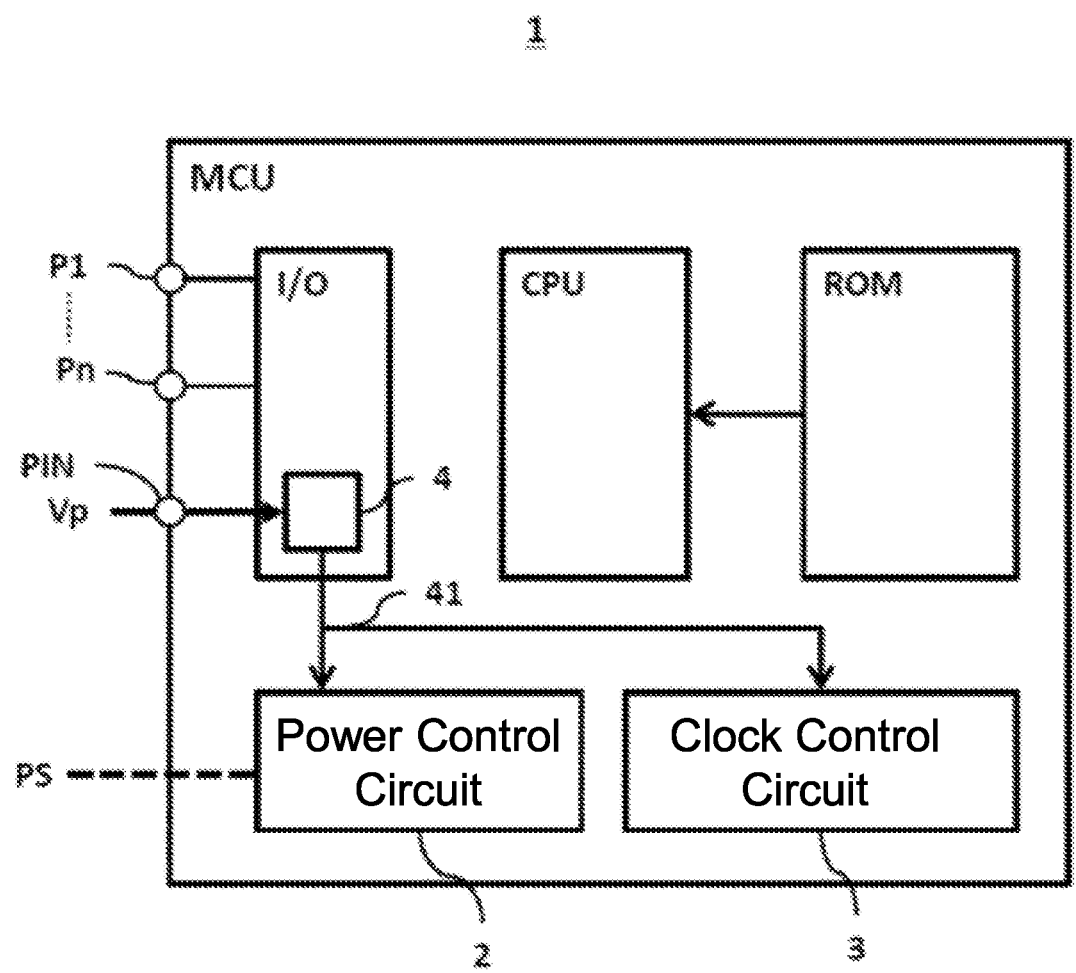
FIG. 1 is a diagram showing a configuration of a semiconductor device according to Embodiment 1.

Those Embodiments will be described below with reference to the drawings. However, in the following description, the same components are denoted by the same reference numerals, and a repetitive description thereof may be omitted. It should be noted that the drawings may be represented schematically in comparison with actual embodiments for the sake of clarity of explanation, but are merely an example and do not limit the interpretation of the present invention.

Embodiment 1

FIG. 1 is a diagram showing a configuration of a semiconductor device according to the Embodiment 1. The semiconductor device 1 is in one instance a microcontroller MCU. The microcontroller MCU includes a non-volatile memory ROM for storing operating programs including a plurality of instructions, and a central processing device CPU, which is a processor for executing the instructions. The microcontroller MCU also includes a power control circuit 2 and a clock control circuit 3 in order to operate the built-in circuit included in the microcontroller MCU.

The power control circuit 2 has a function of generating an internal power supply potential for driving the central processing device CPUs, non-volatile memory ROMs, and the like, and a function of changing a driving capability for adjusting a current supplied to the internal circuit in accordance with loads.

The clock control circuit 3 includes an oscillator, and controls the oscillation operation and the oscillation stoppage of the oscillator, selects the destination of the clock generated by the oscillator, and controls the frequency of the clock to be supplied.

The microcontroller MCU has a low power consumption operation mode in which the maximum current consumption is suppressed by the power control of the power control circuit 2 and the clock control of the clock control circuit 3.

Furthermore, the microcontroller MCU has an input/output circuit I/O connected to external terminals P1 to Pn and PIN. The input/output circuit I/O controls the input and output of the external terminals P1 to Pn. The external terminals P1 to Pn are used for inputting a control signal or a communication signal from an external circuit of the microcontroller MCU or outputting a control signal for controlling the external circuit of the microcontroller MCU. A power supply PS is supplied to the microcontroller MCUs via power supply terminals.

The input/output circuit I/O further comprises a determination circuit 4 connected to the external terminal PIN. When the power supply PS is turned on, the determination circuit 4 determines the voltage level of the voltage signal Vp inputted to the external terminal PIN, and outputs a determination signal 41 to the power control circuit 2 and the clock control circuit 3 in order to select normal start and low-power-consumption start.

That is, the microcontroller MCU has a function of selecting normal start and low-power-consumption start as start sequence according to the voltage levels of the voltage signals Vp inputted to the external terminal PIN of the microcontroller MCU. Part or all of the external terminals P1 to Pn may be controlled by, for example, the determination circuit or the like from the time when the power supply is turned on.

For example, when the power supply PS is a power supply having a sufficient current supply capability, the voltage signal Vp of the high level (H) is input to the external terminal PIN, and when the power supply PS is a power supply not having a sufficient current supply capability, the voltage signal Vp of the low level (L) is input to the external terminal PIN.

When the high level voltage signal Vp is inputted to the external terminal PIN, the determination signal 41 is generated such that the driving capability of the power control circuit 2 is made large or the self-consumption power of the power control circuit 2 is made large, and the frequency of the clock generated from the clock control circuit 3 is made to be a high frequency state or the division ratio of the clock is made small.

On the other hand, when the low level voltage signal Vp is inputted to the external terminal PIN, the determination circuit 4 generates a determination signal 41 for setting the driving capability of the power control circuit 2 to a low state or the self-consumption power of the power control circuit 2 to a low state, and setting the frequency of the clock generated from the clock control circuit 3 to a low frequency state or a state for setting the frequency division ratio of the clock to a high level.

Figure 2:
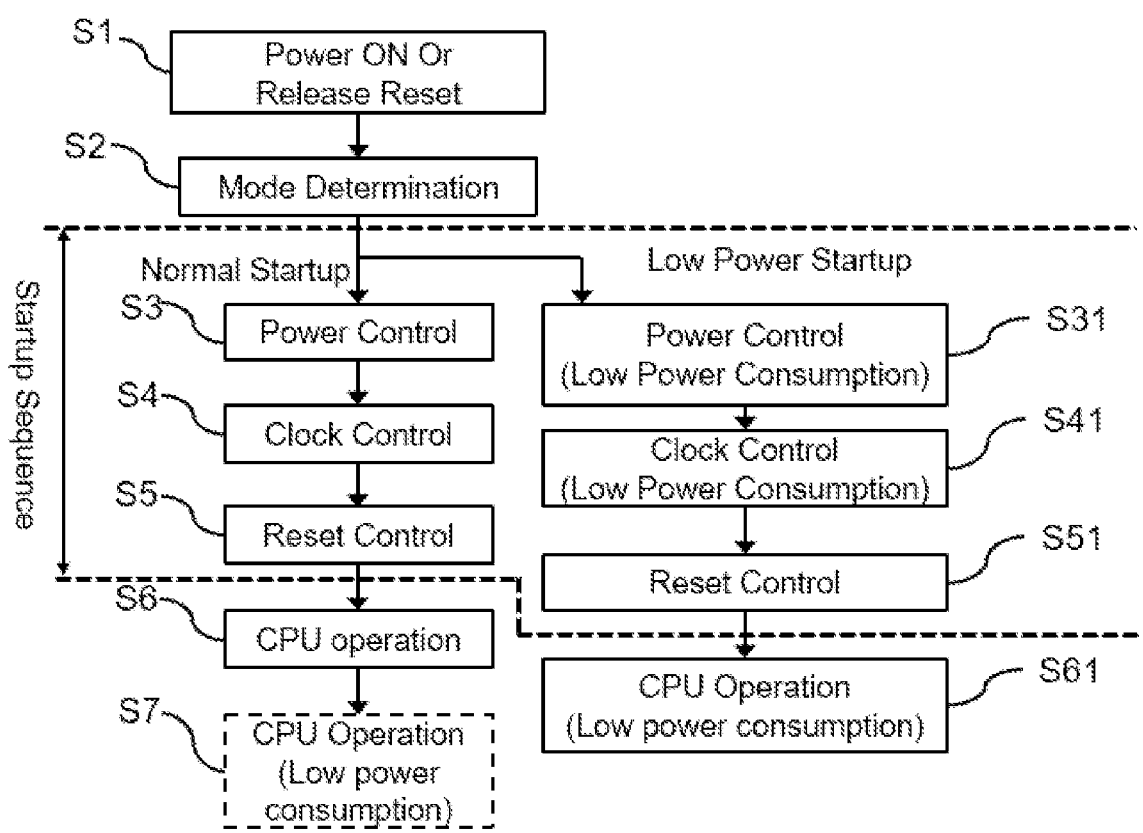
FIG. 2 is a diagram illustrating an operation flow of the semiconductor device according to Embodiment 1.

FIG. 2 is a diagram illustrating an operation flow of the semiconductor device according to the Embodiment 1. The microcontroller MCU of FIG. 1 has a function of selecting normal start and low-power-consumption start operations according to the voltage levels of the voltage signals Vp inputted from the external terminal PIN to the determination circuit 4 when the power supply is turned on or reset is released. Incidentally, three or more start modes may be selectable by using the plurality of external terminals.

When the normal start operation is selected by the voltage level (Vp=H) of the voltage signal Vp inputted to the external terminal PIN and the power supply is turned on or reset is released (step S1), the microcontroller MCU performs the mode determination (step S2) by the determination circuit 4, and then the microcontroller MCU starts the start sequence operation of the normal start.

In the start sequence of the normal start, the power control (step S3), the clock control (step S4), the reset control (step S5) and the like are performed as the initialization process of the built-in circuits of the microcontroller MCU, and the microcontroller MCU is brought into a state in which the CPU operation (step S6) can be promptly started. This is called normal start. In addition to the process time of the control, the start sequence time also includes the steady-state latency of built-in circuits such as power supply and oscillators. When the processing of the start sequence is completed, the central processing device CPU reads the programs stored in the non-volatile memory ROM and starts executing the instructions. If the command includes a power control or clock control, the microcontroller MCU switches the operation status of the microcontroller MCU, for example, the CPU operation to a low-power-consumption state in accordance with the program.

On the other hand, when the low-power-consumption start operation is selected by the voltage level (Vp=L) of the voltage signal Vp inputted to the external terminal PIN and the power supply is turned on or reset is released (step S1), the microcontroller MCU performs the mode determination (step S2) by the determination circuit 4, and then the microcontroller MCU starts the start sequence operation of the low-power-consumption start. In steps S31 and S41, the microcontroller MCU switches the power control and the clock control to the low-power operation during the start sequence of the low-power-consumption start. Thereafter, the reset control (step S51) is executed, and the central process device CPU executes the programs stored in the non-volatile memory ROM in the low-power-consumption operation state (step S61).

In the power control of S31, the power supply circuit built in the microcontroller MCU is set to the driving capability in accordance with the consumption current required by the low-power-consumption start operation, and the consumption current of the power supply circuit is suppressed. In the clock control of S41, the operating frequency of the microcontroller MCU is lowered to suppress the operating current of the entire microcontroller MCU during the start sequence of the low-power-consumption start. In general, when the microcontroller MCU is controlled with low power consumption (S31 to S61), the processing time becomes longer than that of the normal operation (S3 to S6), so that the start of the CPU operation (step S61) is delayed.

Figure 3:
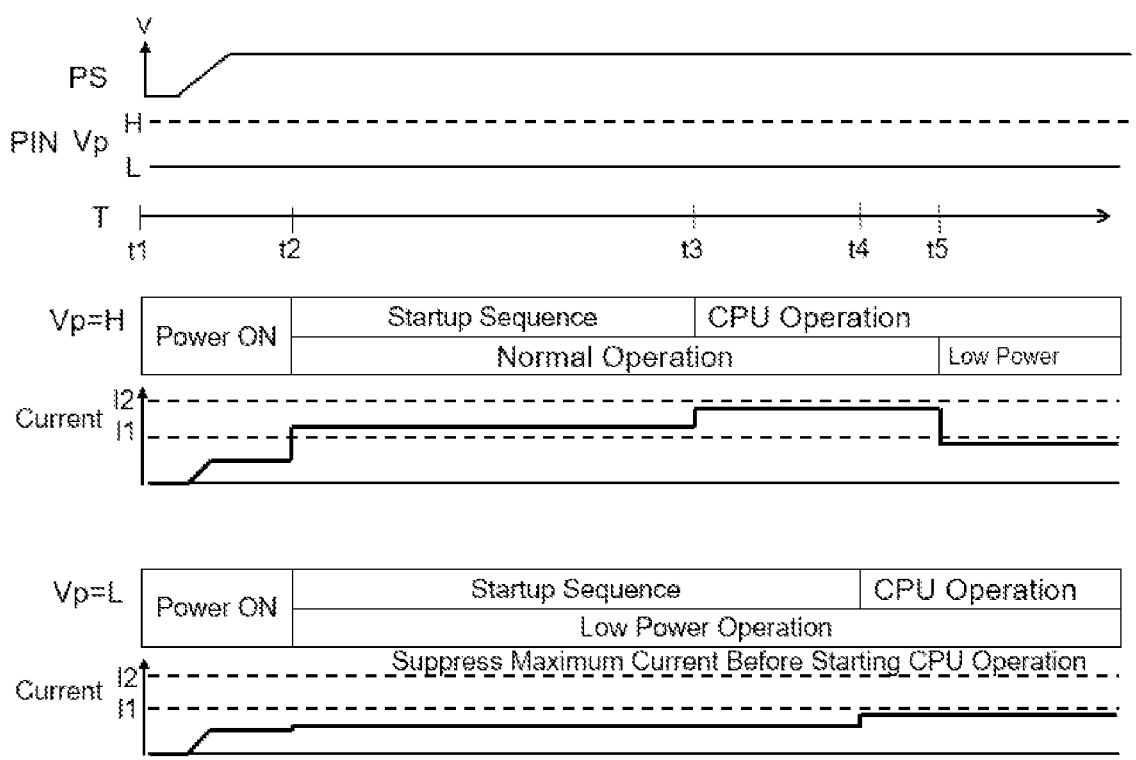
FIG. 3 is a schematic diagram illustrating power consumptions and process times of a normal start and a low-power-consumption start.

FIG. 3 is a schematic diagram illustrating the power consumptions and process times of the normal start and the low-power-consumption start. FIG. 3 shows the variation of the voltage V of the power supply PS, the high level (H) or the low level (L) of the voltage signal Vp inputted to the external terminal PIN, the duration T and the current I consumed by the microcontroller MCU. In the current I consumed by the microcontroller MCU, I1 indicates the allowable current amount at the time of low-power-consumption start, and I2 indicates the allowable current amount at the time of normal start. The allowable current amount I1 at the time of low-power-consumption start is set to be smaller than the allowable current amount I2 in the normal start (I1 2).

First, the operation of the normal start is selected by setting the voltage signal Vp inputted to the external terminal PIN to the voltage signal high level H (Vp=H), and the power supply is turned on or reset is released.

From time t1 to time t2, the power supply is turned on or reset is released. The current I consumed by the microcontroller MCU changes to a predetermined current value in accordance with the change in the voltage V of the power supply PS, but the current I consumed by the microcontroller MCU flows from the time t1 to the time t2 to such an extent that the current I does not exceed the allowable current amount I1.

From time t2 to time t3, the start sequence of the normal operation is executed. The consumption current I of the microcontroller MCU flows to such an extent that it exceeds the allowable current amount I1 but does not exceed the allowable current amount I2.

From time t3 to time t5, the CPU operation of the normal operation is executed. The consumption current I of the microcontroller MCU flows to such an extent that it does not exceed the allowable current amount I2. In this example, after the time t5, the CPU operation of the low power consumption operation is executed by the instruction execution, and the consumption current I of the microcontroller MCU is suppressed to such an extent that it does not exceed the allowable current amount I1.

On the other hand, when the voltage signal Vp inputted to the external terminal PIN is set to low level L (Vp=L), the low-power-consumption start operation is selected, and the power supply is turned on or reset is released.

From time t1 to time t2, the power supply is turned on or reset is released. The current I consumed by the microcontroller MCU changes to a predetermined current value in accordance with the change in the voltage V of the power supply PS, but the current I consumed by the microcontroller MCU flows from the time t1 to the time t2 to such an extent that the current I does not exceed the allowable current amount I1.

From time t2 to time t4, the start sequence of the low-power operation is executed. Although the consumption current I of the microcontroller MCU is larger than the consumption current I from the time t1 to the time t2, it flows to such an extent that it does not exceed the allowable current amount I1.

From time t4 to time t5, the CPU operation of the low power consumption operation is executed. Although the consumption current I of the microcontroller MCU is larger than the consumption current I from the time t2 to the time t4, it flows to such an extent that it does not exceed the allowable current amount I1.

If the microcontroller MCU is mounted in a semiconductor system having a power supply PS which does not have a sufficient current supply capability and the microcontroller MCU is operated in a normal operation start sequence with a power supply PS having a low supply current, the microcontroller MCU may not be able to operate stably when the maximum operating current of the microcontroller MCU exceeds the supply current of the power supply PS. After the CPU operation is started, the operation mode can be shifted to the low power consumption operation mode by executing an instruction, but if the current consumption of the start sequence operating prior to the CPU operation exceeds the power supply capability of the power supply PS, malfunction or failure of the semiconductor system may occur.

However, as shown in FIG. 3, when the voltage signal Vp inputted to the external terminal PIN is set to low level L (Vp=L) and the low-power-consumption start operation is selected and the power supply is turned on or reset is released, the voltage signal Vp inputted to the external terminal PIN can be switched from the start sequence process executed after time t2 to the operation mode of the low power consumption operation. As a result, although the maximum current consumed by the microcontroller MCU is suppressed to be equal to or less than the allowable current I1 at the time of low-power-consumption start, the microcontroller MCU can operate stably. However, since the process time becomes longer, the time from the power supply input to the start of the CPU operation becomes longer.

That is, when the voltage signal Vp input to the external terminal PIN is set to low level L (Vp=L), the start sequence time (from time t2 to time t4) becomes longer, but since the microcontroller MCU enters the operation mode of the low power consumption operation mode after the power supply is turned on, the current consumption of the microcontroller MCU becomes small, and it is possible to stably CPU start the voltage signal Vp even in an environment in which the power supply supply capability is low (an environment in which the microcontroller MCU does not have a sufficiently high current supply capability) (power supply PS).

On the other hand, when the power supply PS having the enough current supplying capability is used, the voltage signal Vp inputted to the external terminal PIN is set to the high level H (Vp=H), and the operation of the normal start is selected and the CPU is power supply turned on or reset is released, so that the time from after the power supply is turned on to the start of the CPU operation is shortened (from time t2 to time t3).

Embodiment 1 shows an exemplary configuration in which the voltage levels of the voltage signal Vp inputted to the external terminal PIN are determined after the power supply is turned on or reset is released. The external terminal PIN may change the function of the external terminal PIN so that it can be used as an input external terminal, an output external terminal, or an input/output external terminal after the power supply is turned on or reset is released.

According to Embodiment 1, one or more of the following effects can be obtained.

1) By judging the voltage levels of the voltage signals Vp inputted to the external terminal PIN, the microcontroller MCU can select between the operation (low-power-consumption start) in which the instantaneous current is suppressed and the high-speed operation (normal start) in the period from the power supply input to the CPU operation start (hereinafter, referred to as "start sequence") of the microcontroller MCU.

2) When the microcontroller MCU is mounted on a semiconductor system combined with a power supply which does not have enough current supplying capability, the voltage signal Vp inputted to the external terminal PIN is set to low level L (Vp=L). As a result, the start sequence of the microcontroller MCU can be set to an operation in which the instantaneous current of the microcontroller MCU is suppressed. Therefore, the microcontroller MCU can perform stable start.

3) When the microcontroller MCU is mounted on a semiconductor system combined with a power supply having adequate current supplying capability, the voltage signal Vp inputted to the external terminal PIN is set to high level H (Vp=H). As a result, the start sequence of the microcontroller MCU can be operated at a high speed. Thus, the microcontroller MCU can be operated with high performance.

4) The switching function of the start sequence operation can achieve both the operation in which the instantaneous current is suppressed and the high-speed operation in accordance with the current supplying capability of the power supply. Therefore, it is possible to achieve both the normal operation and the low power consumption operation while using the same microcontroller MCU.

Embodiment 2

In the configuration of Embodiment 1, a stable start was realized by suppressing the current consumed in the start sequence. However, if the operation is performed in the low-power-consumption start mode, the process time of the start sequence becomes long, and the integrated leakage current during the process becomes large. When the same processing is performed by the central processing device CPU, it is possible to reduce leakage current components by operating the CPU at a higher speed by operating the CPU at a normal start than the low-power-consumption start CPU and completing the processing at a higher speed. The Embodiment 2 provides a low-power-consumption operation unit in which the integrated leakage current is reduced.

Figure 4:
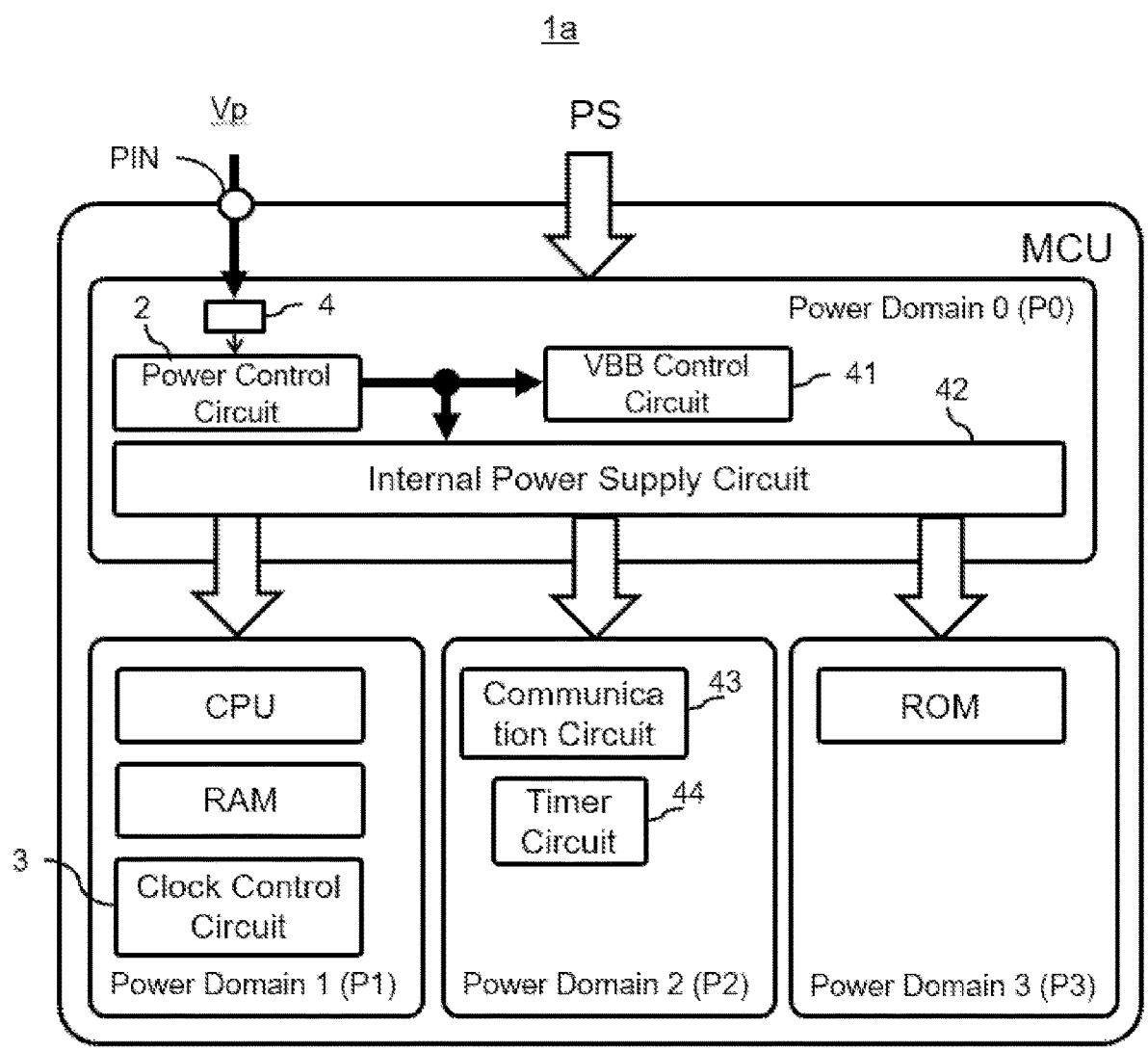
FIG. 4 is a diagram showing a configuration of a semiconductor device according to Embodiment 2.

FIG. 4 is a diagram showing a configuration of a semiconductor device according to the Embodiment 2. The semiconductor device 1a, which is a microcontroller MCU, is composed of a transistor TRS having a SOTB (Silicon ON Thin Buried oxide structure using an SOI (Silicon On Insulator) art. In the Embodiment 2, a control method is used in which a voltage (hereinafter, referred to as a substrate bias voltage voltage VBB) is applied to the well layer 53 of the transistor TRS to reduce the leakage current of the well layer 53.

Figure 5:
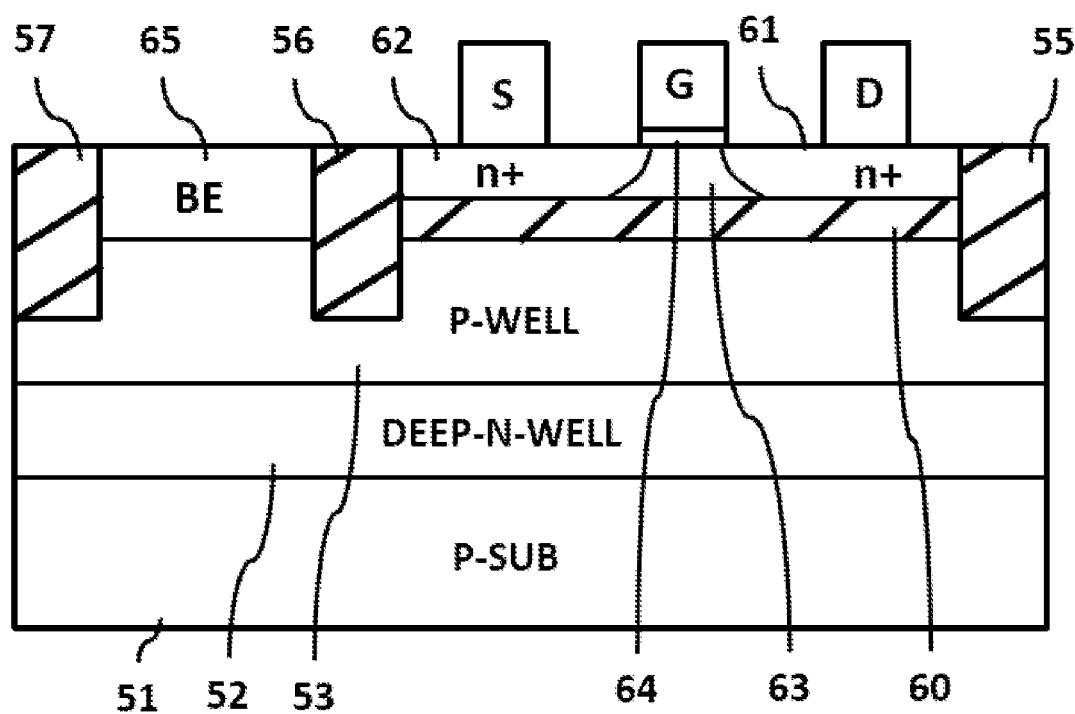
FIG. 5 is a cross-sectional view showing a configuration example of a transistor.

First, the structure of the transistor TRS will be briefly described with reference to FIG. 5. FIG. 5 is a cross-sectional view showing an exemplary configuration of a transistor TRS having a SOTB structure.

FIG. 5 exemplarily shows a cross-sectional structure of an N-channel transistor TRS. The transistor TRS includes a P-type substrate (P-SUB) 51 such as monocrystalline silicon, an N-type well layer (DEEP-N-WELL) 52 provided on the P-type substrate 51, and a P-type well layer (P-WELL) 53 provided on the N-type well layer 52. The N-channel transistor TRS has three element isolation insulating films 55, 56, and 57. Between the insulating films 55 and 56, a buried insulating film 60 having a small thickness is formed on the P-type well P-WELL 53. On the insulating film 60, an N+ type region (n+) 61 serving as a drain region of the transistor TRS, an N+ type region (n+) 62 serving as a source region of the transistor TRS, and a channel region 63 are provided between the N+ type region 61 and the N+ type region 62. The channel region 63 can be, for example, a region into which an impurity is not introduced.

A drain electrode D is selectively formed on the N+ type region 61. A source electrode S is selectively formed on the N+ type region 62. A gate electrode G is formed on the channel region 63 with a gate insulating film 64 interposed therebetween. On the other hand, a buried electrode 65 for applying the substrate potential VBB to the P-type well layer 53 is formed on the P-type well layer 53 between the insulating films 56 and 57.

In the N-channel transistor TRS shown in FIG. 5, since impurities are not mixed into the channel region 63, stable operation at a low voltage is enabled, and the calculation performance can be exhibited with high power efficiency. On the other hand, when the semiconductor device 1a is in standby, the substrate potential of the P-type well layer 53 below the buried insulating film 60 is controlled by the buried electrodes (BEs) (substrate bias voltage VBB control), whereby the leakage current of the transistor TRS can be reduced and the standby power of the semiconductor device 1a can be suppressed. Note that although FIG. 5 shows a configuration example of an N-channel transistor TRS, a skill in art can easily understand that a P-channel transistor can be configured based on the same idea, and therefore description of a configuration example of a P-channel transistor is omitted. The semiconductor device 1a can be composed of a plurality of CMOS circuits each composed of an N-channel transistor TRS and a P-channel transistor TRS.

As shown in FIG. 4, the microcontroller MCU is divided into four power supply domains (P0 to P3), and each of the power supply domains 0 to 3 (P0 to P3) is assigned a function of the microcontroller MCU. The power supply domain 0 (P0) includes a power control circuit 2, the determination circuit 4, a VBB control circuit 41, and an internal power supply circuit 42 that are responsible for the entire power control of the microcontroller MCU, and operates on a power supply PS supplied from the outside of the microcontroller MCU. The power supply domain 0 (P0) has a function of ON/OFF supplying power supply to each of the power supply domains 1 to 3 (P1 to P3). When power supply is supplied to power supply of the domains 1 to 3 (P1 to P3), a leakage current is generated even if a function included in the domain is not used.

The built-in functions of the microcontroller MCUs are assigned to the power supply domain 1 (P1) to the power supply domain 3 (P3). The power supply domains 1 (P1) include, for example, central processing device CPUs, volatile memory RAMs, and clock control circuits 3. The power supply domains 2 (P2) include, for example, a communication circuit 43 and a timer circuit 44. The power supply domains 3 (P3) include, for example, non-volatile memory ROMs.

The power supply domain 0 (P0) includes a substrate bias control circuit 41 including a function of generating the substrate bias voltage voltage VBB and a function of switching the substrate bias voltage voltage VBB. By switching the substrate bias voltage voltage VBB, the leakage current of the microcontroller MCU is reduced. In the substrate bias voltage control for generating the substrate bias voltage voltage VBB, the generation of the substrate bias voltage voltage VBB and the stabilization of the potential of the substrate bias voltage voltage VBB are required in order to continue the normal operation of the built-in circuits of the micro-controller MCU. Therefore, it should be noted that the substrate bias voltage voltage VBB cannot be switched immediately after the VBB control circuit 41 starts the substrate bias voltage control.

Figure 6:
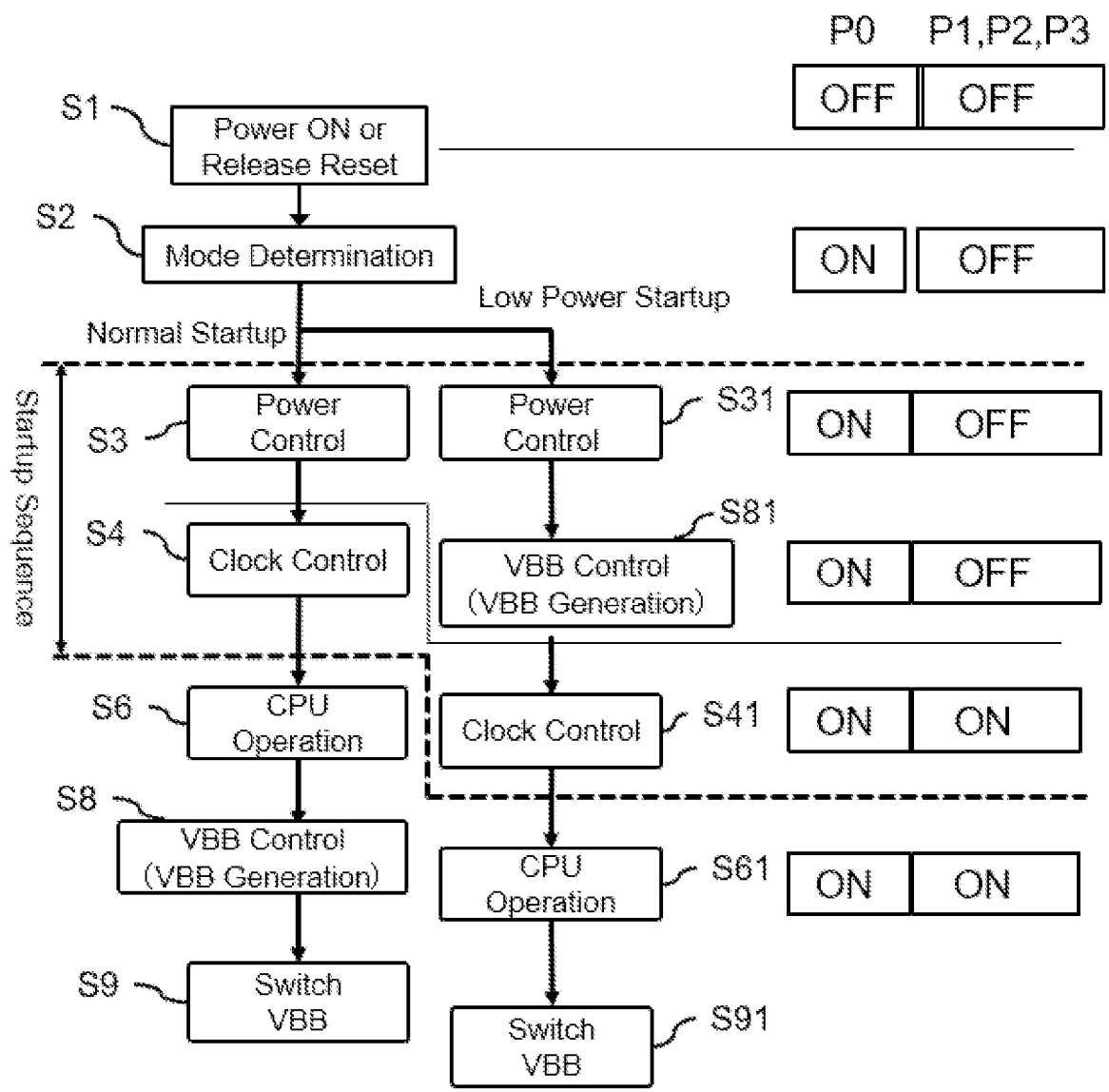
FIG. 6 is a diagram illustrating an operation flow of the semiconductor device according to Embodiment 2.

FIG. 6 is a diagram illustrating an operation flow of the semiconductor device according to the Embodiment 2. Like FIG. 1, the microcontroller MCU of FIG. 4 has a function of selecting normal start and low-power-consumption start operations according to the voltage levels of the voltage signals Vp inputted from the external terminal PIN to the determination circuit 4 when the power supply is turned on or reset is released.

When the normal start operation is selected by the voltage level (Vp=H) of the voltage signal Vp inputted to the external terminal PIN and the power supply is turned on or reset is released (step S1), the microcontroller MCU performs the mode determination (step S2) by the determination circuit 4, and then the microcontroller MCU starts the start sequence operation of the normal start. In the periods of step S1 and step S2, the power supply PS is supplied to the power supply domain P0 (ON), and the inner power supply is not supplied to the power supply domains P1 to P3 (OFF).

In the start sequence of the normal start, the power control (step S3) and the clock control (step S4) are performed as the initialization process of the built-in circuits of the microcontroller MCU, and the microcontroller MCU is brought into a state in which the CPU operation (step S6) can be promptly started. In FIG. 6, the reset control S5 shown in FIG. 2 is omitted. In S3, the power supply PS is supplied to the power supply domain P0 (ON), and the inner power supply is not supplied to the power supply domains P1 to P3 (OFF). On the other hand, in S4, the power supply PS is supplied to the power supply domain P0 (ON), and the inner power supply is supplied to the power supply domains P1 to P3 (ON).

After step S6, when it is desired to switch the substrate bias voltage voltage VBB to reduce the leakage current (step S9), substrate bias voltage control (VBB control: step S8) is performed before step S9. In S8, the generation of the substrate bias voltage voltage VBB and the stabilization of the potential of the substrate bias voltage voltage VBB are performed. After the completion of step S8, in step S9, the substrate bias voltage voltage VBB is switched to a low-power-consumption mode in which the leakage current is reduced. During the VBB control (state S8), since the VBB control needs to wait while the internal power supply is supplied to the power supply domains P1 to P3 (step S8), the leakage current continues to occur in the internal circuits disposed in the power supply domains P1 to P3.

On the other hand, when the low-power-consumption start operation is selected by the voltage level (Vp=L) of the voltage signal Vp inputted to the external terminal PIN and the power supply is turned on or reset is released (step S1), the microcontroller MCU performs the mode determination (step S2) by the determination circuit 4, and then the microcontroller MCU starts the start sequence operation of the low-power-consumption start. In the periods of step S1 and step S2, the power supply PS is supplied to the power supply domain P0 (ON), and the inner power supply is not supplied to the power supply domains P1 to P3 (OFF).

In the start sequence of the low-power-consumption start, the power control (step S31), the substrate bias voltage control (VBB control: step S81), and the clock control (step S41) are executed in this order. The power control (step S31) and the clock control (step S41) are executed by switching to the low-power-consumption operation in the same manner as in FIG. 2.

Here, the power control (step S31) and the substrate bias voltage control (VBB control: step S81) are executed in a state (ON) in which the power supply PS is supplied to the power supply domain P0, and in a state (OFF) in which the inner power supply is not supplied to the power supply domains P1 to P3. On the other hand, the clock control (S41) is executed in a state (ON) in which the power supply PSs are supplied to the power supply domain P0, and in a state (ON) in which the inner power supply is supplied to the power supply domains P1 to P3.

That is, in the Embodiment 2, a time-consuming substrate bias voltage control (VBB control: step S81) is performed prior to supplying the inner power supply to the power supply domains P1 to P3. Since the internal power supply is not supplied to the power supply domains P1 to P3 during the operation S81, the leakage current is not generated in the internal circuits corresponding to the power supply domains P1 to P3.

After the clock control (step S41), the central process device CPU executes the programs stored in the non-volatile memory ROMs in a low-power-consumption operation (CPU operation: step S61). After step S61, in step S91, the substrate bias voltage voltage VBB is switched, and the mode shifts to a low-power-consumption mode in which the leakage current is reduced.

According to Embodiment 2, similarly to Embodiment 1, the start sequence time is longer than the normal start time at the time of low-power-consumption start. However, since the substrate bias voltage control (step S81) is completed at the time of starting the CPU operation (step S61), the CPU can immediately switch the substrate bias voltage voltage VBB (step S91).

According to Embodiment 2, the following effects can be obtained.

1) In low-power-consumption start, the substrate bias voltage voltages can be switched as soon as the CPUs start operating. By switching the substrate bias voltage voltages, the leakage current of the built-in circuits is reduced. It is also possible to cope with a normal start in which the reduction of the time from the time when the power supply is turned on or reset is released to the time when the CPU starts operating is prioritized.

2) When the low-power-consumption start is selected, a leakage current is not generated during the substrate bias voltage control after the power supply is turned on or the resetting is released. Therefore, when the power supply supplier is a storage battery, the life of the storage battery can be prolonged.

Figure 7:
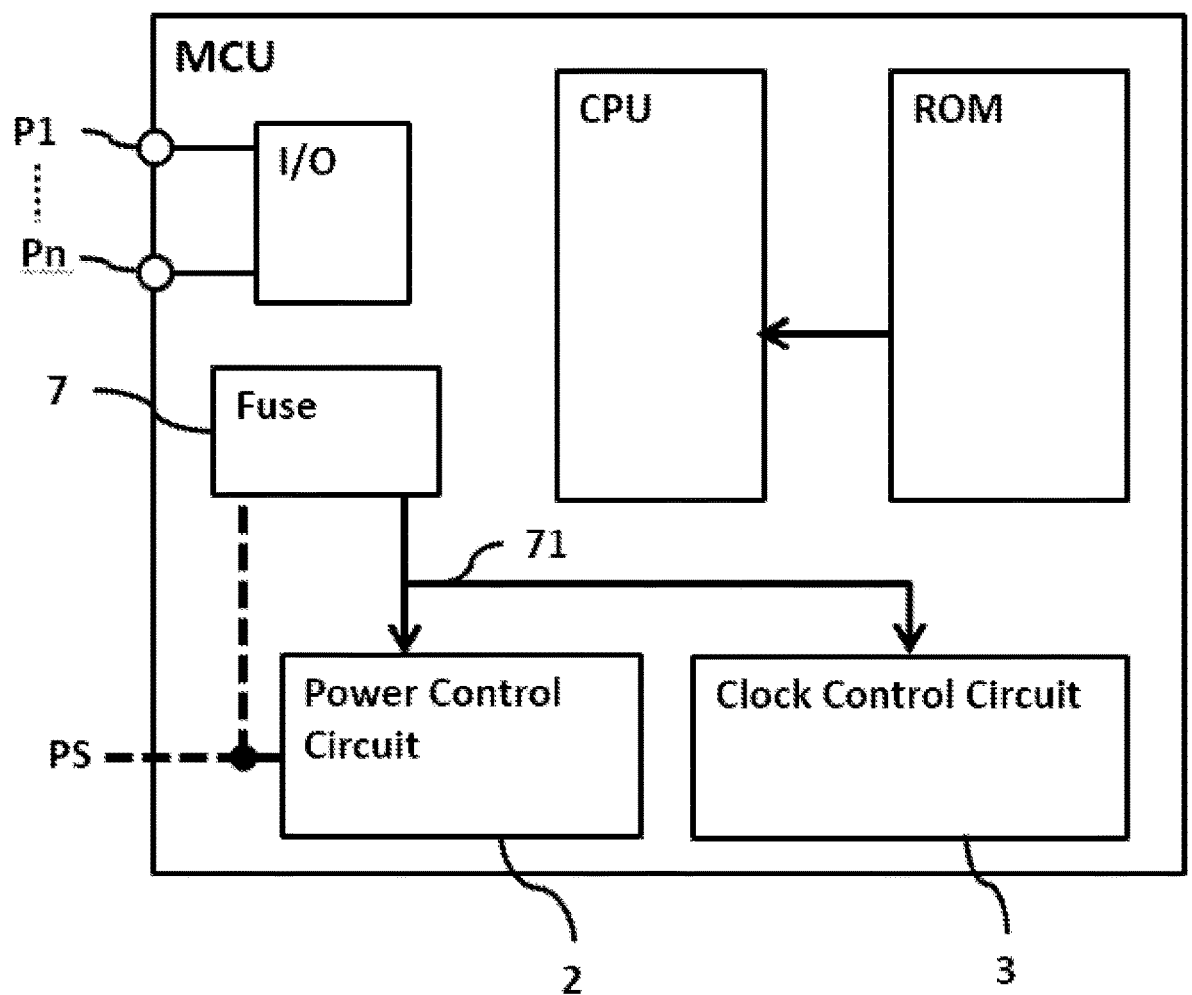
FIG. 7 is a diagram showing a configuration of a semiconductor device according to Embodiment 3.

FIG. 7 is a diagram showing a configuration of a semiconductor device according to the Embodiment 3. In the Embodiment 3, the external terminal PIN existing in the Embodiment 1 and the Embodiment 2 do not exist. Instead, the semiconductor device 1b, which is a microcontroller MCU, is provided with fuse circuits 7 for switching modes. Depending on the state of the fuse-circuit 7, it is previously selected whether to operate in normal start or low-power-consumption start. The power control circuit 2 and the clock control circuit 3 have a function of switching the start sequence operation in accordance with the status signals 71 of the fuse circuit 7. The fuse circuit 7 may be a non-volatile memory ROM. The rest of the configuration is the same as that of the Embodiment 1, and therefore the explanation thereof is omitted.

According to the Embodiment 3, since the control of the external terminal PIN existing in the Embodiment 1 or the Embodiment 2 is not necessary, the external terminal PIN can be reduced. Therefore, the number of external terminal provided in the microcontroller MCU can be reduced.

In the configuration of the Embodiment 1, the maximum current consumption is suppressed by decreasing the clock frequency supplied from the clock control circuit 3. On the other hand, the low-power-consumption start can also be realized by switching the start sequence process methods.

Figure 8:
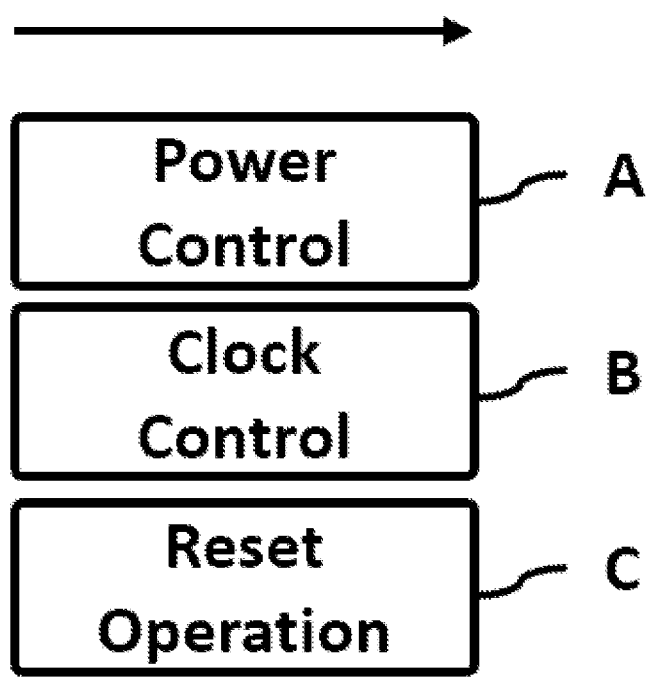
FIG. 8 is a diagram showing start sequence of a normal start according to Embodiment 4.
Figure 9:
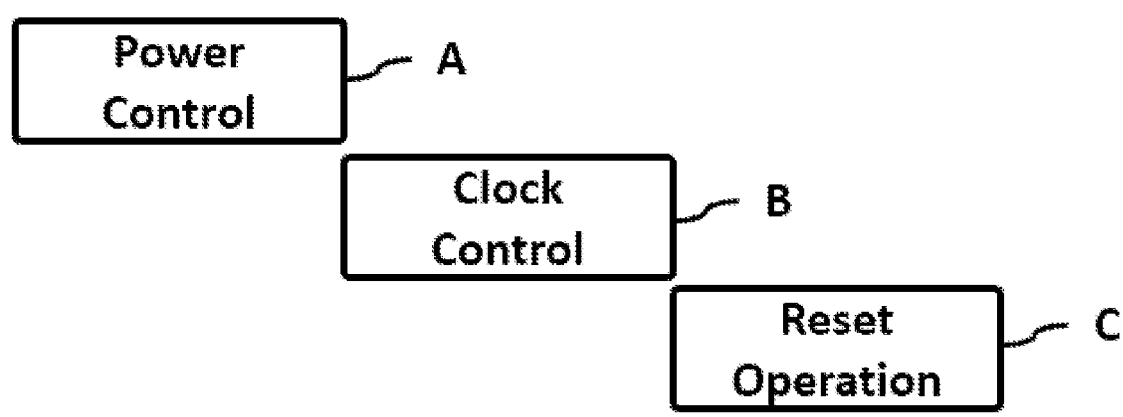
FIG. 9 is a diagram showing start sequence of a low-power-consumption start according to Embodiment 4.
Figure 10:
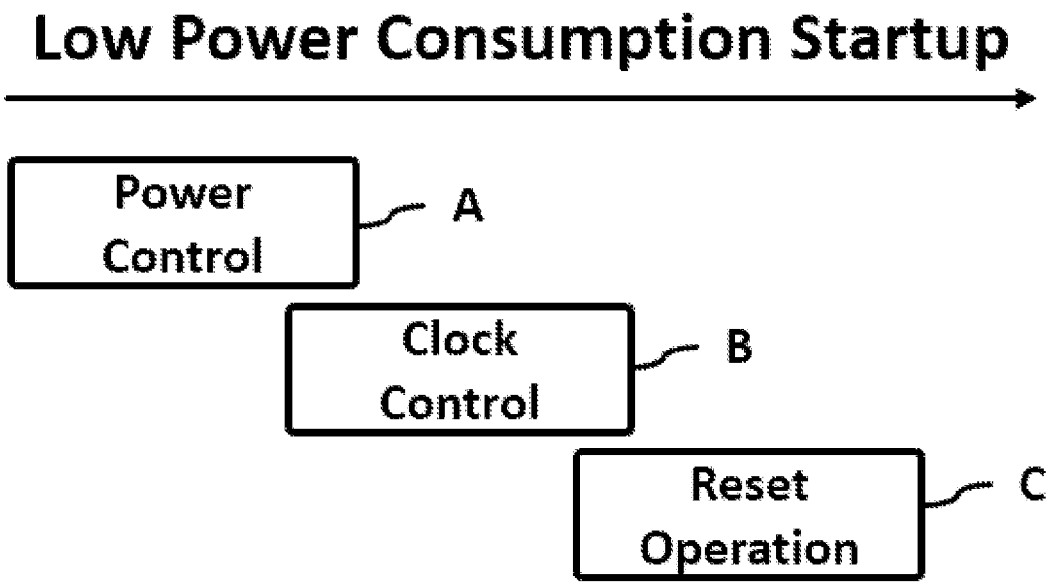
FIG. 10 is a diagram showing start sequence of a low-power-consumption start according to the modified example.

FIG. 8 is a diagram showing an start sequence of the normal start according to the Embodiment 4. FIG. 9 is a diagram showing an start sequence of the low-power-consumption start according to the Embodiment 4. FIG. 10 is a diagram showing an start sequence of the low-power-consumption start according to the modified example.

In addition to the power control A and the clock control B, the start sequence of the MCU requires the reset control C of the microcontroller MCU as well as the built-in circuits of the MCU.

As shown in FIG. 8, in the normal start, the power control A, the clock control B, and the reset control C are operated in parallel in order to shorten the start sequence process time. As shown in FIG. 9, in the low-power-consumption start, these processes (power control A, clock control B, and reset control C) are sequentially processed in order to suppress the instantaneous current. By this process, it is possible to suppress the maximal current consumed in the same manner as in Embodiment 1.

In FIG. 9, the next clock control B is started after the power control A is completed, and the next reset control C is started after the clock control B is completed, but the present invention is not limited thereto. Since the aim is to suppress the higher instantaneous current by concurrently performing a plurality of processes (power control A, clock control B, and reset control C), a part of each process (power control A, clock control B, and reset control C) may be performed concurrently with other processes, as shown in FIG. 10. That is, the power control A and the clock control B may be partially overlapped, and the clock control B and the reset control C may be partially overlapped.

Next, some application examples when the semiconductor device 1 of the Embodiment 1 is applied to semiconductor systems will be described. In the applied example, a configuration example is shown in which the voltage signal Vp inputted to the external terminal PIN is interlocked with the voltage signal Vp selected from the power supply PS.

Figure 11:
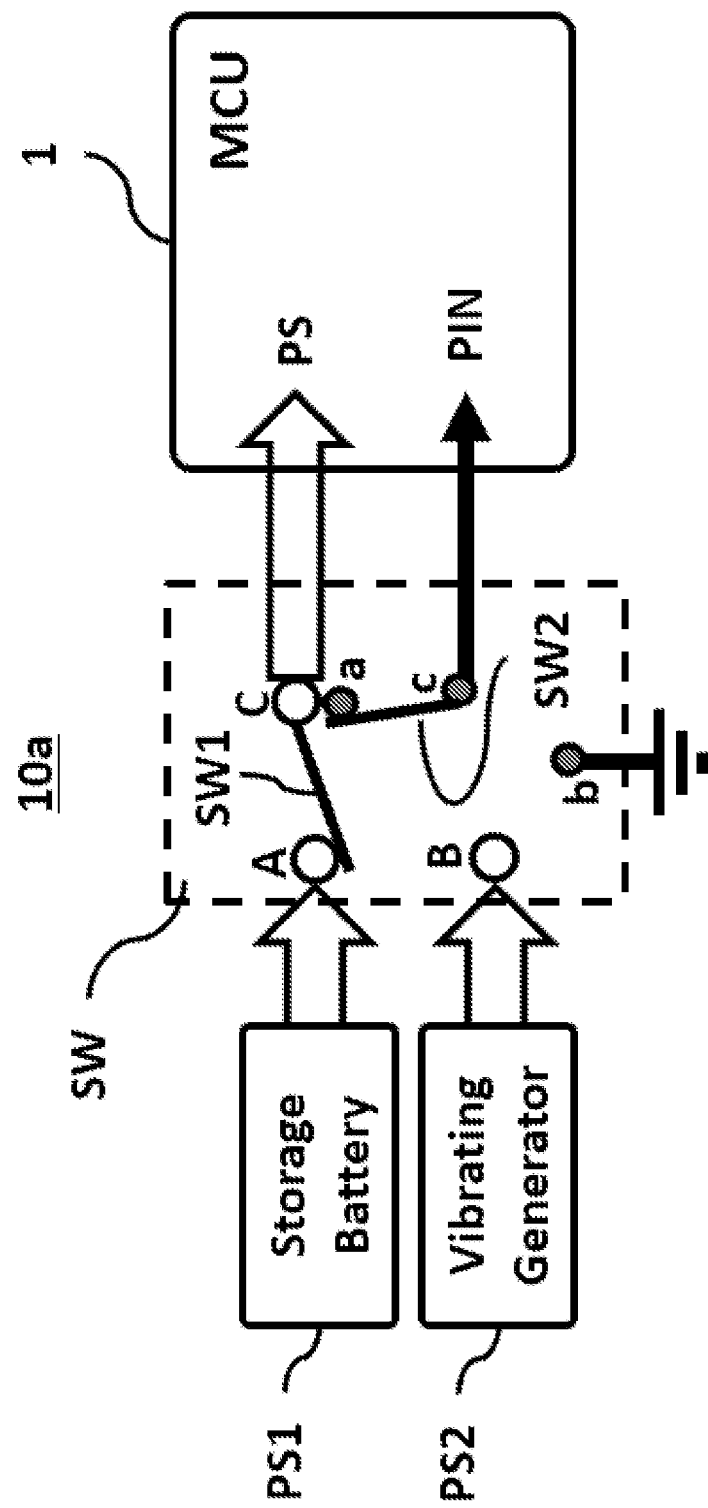
FIG. 11 is a diagram illustrating a configuration example of a semiconductor system according to an application example 1.

FIG. 11 is a diagram showing a configuration example of a semiconductor system according to Application Example 1. In the semiconductor system 10a on which the microcontroller MCU is mounted, the switching circuit SW selects a power supply device (here, as an example, a storage battery) PS1 having a sufficient current supply capability and a power supply device (here, as an example, a vibrating generator) PS2 not having a sufficient current supply capability. The switch circuit SW includes a first switch SW1 and a second switch SW2.

The first switch SW1 has a terminal A to which the power supply device PS1 is supplied, a terminal B to which the power supply device PS2 is supplied, and a terminal C to which the power supply PS of the microcontroller MCU is supplied, and selectively connects the terminal A and the terminal C or the terminal B and the terminal C. On the other hand, the second switch SW2 has a terminal a connected to the terminal C, a terminal b connected to the ground potential GND, and a terminal c connected to the external terminal PIN of the microcontroller MCU, and selectively connects the terminal a to the terminal c or the terminal b to the terminal c of the microcontroller MCU.

When the first switch SW1 connects the terminal A and the terminal C, the second switch SW2 connects the terminal a and the terminal c in conjunction therewith. In the case, the high level voltage signal Vp is supplied to the external terminal PIN of the microcontroller MCU. On the other hand, when the first switch SW1 connects the terminal B and the terminal C, the second switch SW2 connects the terminal b and the terminal c in conjunction therewith. The low level voltage signal Vp is supplied to the external terminal PIN of the microcontroller MCU.

When the microcontroller MCU is driven by the power supply device PS1 having enough current supplying capability, the microcontroller MCU can be operated in the normal start of high-speed start. However, when the power supply device PS2 which does not have enough current supply capability is supplied, the instantaneous current becomes a problem, and when the current consumed by the start sequence exceeds the supply current, the start to the operation of the CPUs cannot be performed. Here, by changing the start sequence in conjunction with the selection of the power supply source (PS1, PS2), it is possible to construct the semiconductor system 10a corresponding to both the normal start and the low-power-consumption start while using the same microcontroller (MCU).

Figure 12:
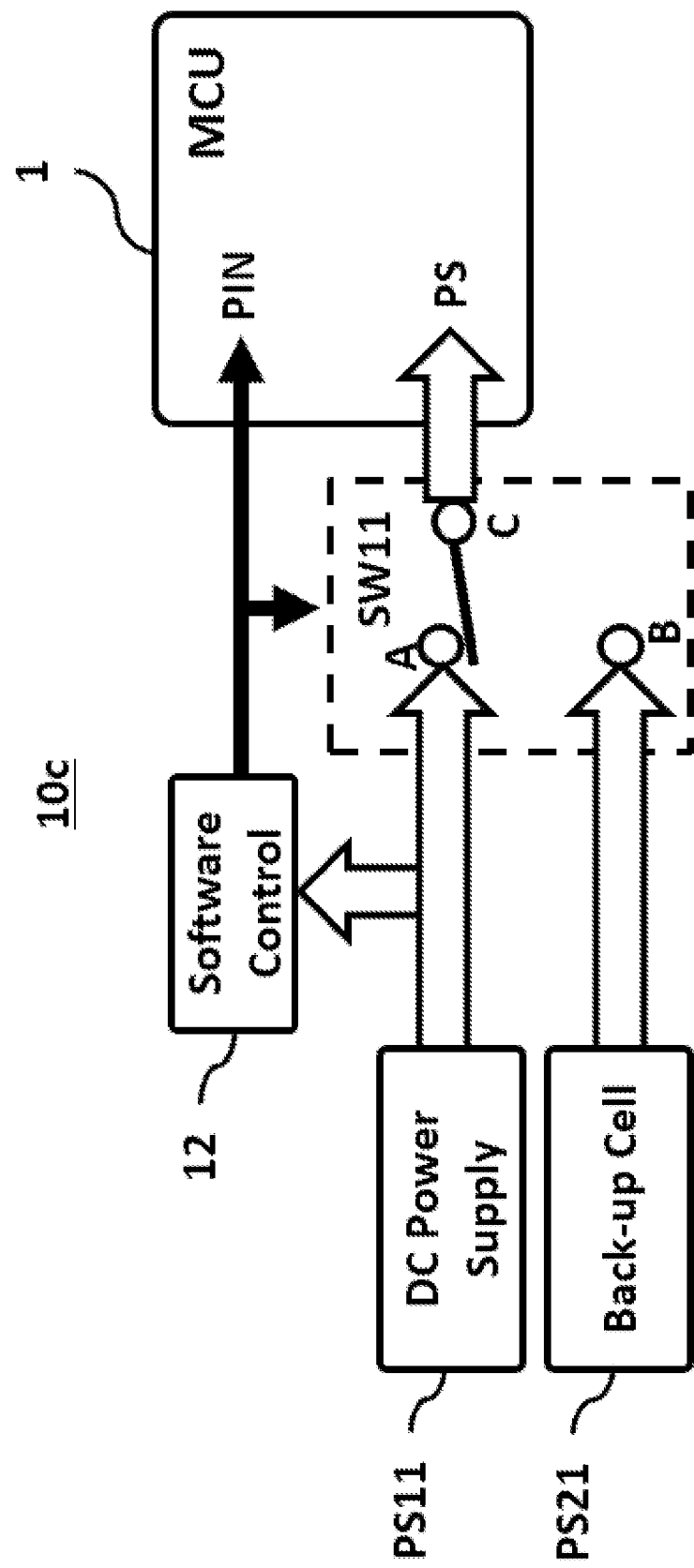
FIG. 12 is a diagram illustrating a configuration example of a semiconductor system according to application example 2.

FIG. 12 is a diagram showing a configuration example of a semiconductor system according to Application Example 2. In the semiconductor system 10b including the microcontroller MCU, the semiconductor system 10b has two systems, that is, a power supply device (here, as an example, a direct current (DC) power supply) PS11 having a high current supply capability and a power supply device (here, as an example, a back-up cell) PS21 having a low current supply capability. When the power supply from the power supply device PS11 is supplied, the switch control circuit 12 outputs the high level voltage signal Vp to the external terminal PIN of the microcontroller MCU. The switch control circuit 12 connects the terminal A and the terminal C of the switch SW11, whereby the power supply device PS11 is supplied as the power supply PS of the microcontroller MCU. Therefore, the power supply from the back-up cell PS21 is cut off. On the other hand, when the power supply from the power supply device PS11 is not supplied, the switch control circuit 12 outputs the low level voltage signal Vp to the external terminal PIN of the microcontroller MCU. The switch control circuit 12 connects the terminal B and the terminal C of the switch SW11, whereby the power supply from the power supply device PS21 is supplied to the microcontroller MCU as the power supply PS of the microcontroller MCU. As described above, the switch control circuit 12 determines whether or not the power supply device PS11 is supplied, and the normal start and the low-power-consumption start are selected in conjunction with the control of the switch SW11 presence or absence the switching function of the power supply supply source PS11, PS21. Thus, by changing the start sequence in conjunction with the selection of the power supply supplier (PS11, PS21), it is possible to construct the semiconductor system 10b corresponding to both the normal start and the low-power-consumption start while using the same microcontroller (MCU).

Figure 13:
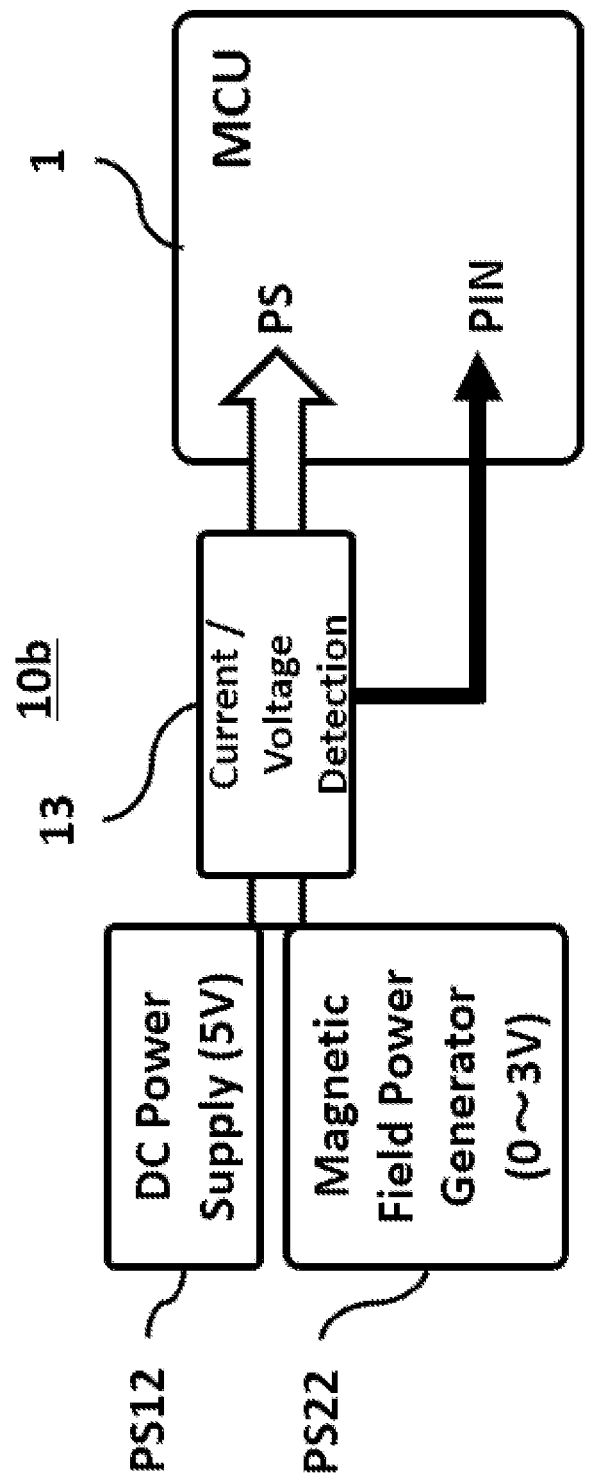
FIG. 13 is a diagram illustrating a configuration example of a semiconductor system according to an application example 3.

FIG. 13 is a diagram showing a configuration example of a semiconductor system according to Application Example 3. The semiconductor system 10c includes two power supply PS12 and PS22, which are supplied with different voltages. A power supply device (here, as an example, a DC power supply of a 5V) PS12 having a high current supply capability has a higher voltage than a power supply device (here, as an example, a magnetic field power generating device capable of generating a voltage of 0V~3V) PS22 having a low current supply capability. The start sequence is switched in accordance with the determination result of the current quantity detection/voltage detection circuit 13 for detecting the voltage.

When the power supply device PS12 generates a power supply of 5V, the current sense/voltage sense circuit 13 provides a power supply of 5V to the power supply PS of the microcontroller MCU and outputs high level voltage signals Vp to the external terminal PIN of the microcontroller MCU. On the other hand, when there is no power supply supplied from the power supply device PS12 and the power supply device PS22 generates power supply, the current amount detection/voltage detection circuit 13 supplies the power supply generated by the power supply device PS22 to the power supply PS of the microcontroller MCU, and outputs the low level voltage signal Vp to the external terminal PIN of the microcontroller MCU.

While the invention made by the present inventor has been specifically described above based on the Embodiment, the present invention is not limited to the above-described embodiment and Embodiment, and it is needless to say that the present invention can be variously modified.

What is claimed is:

1. A semiconductor device comprising:
an external terminal;
a determination circuit configured to determine a voltage of the external terminal;
a power supply control circuit;
a clock control circuit;
a CPU; and
a non-volatile memory,
wherein the semiconductor device selects one of start sequences of normal start and low-power-consumption start based on a determination result of the determination circuit,
wherein the start sequence of the low-power-consumption start takes a longer period of time to complete than the start sequence in the normal start,
wherein the start sequence includes a power supply control, a clock control, and a reset control,
wherein after the start sequence, the CPU executes instructions stored in the non-volatile memory,
wherein the semiconductor device further comprises a substrate bias control circuit configured to generate a substrate bias voltage and changing a substrate bias voltage,
wherein, when the low-power-consumption start is selected, the substrate bias control circuit generates the substrate bias voltage between the power supply control and the clocking control, and changes the substrate bias voltage after the CPU executes instructions stored in the non-volatile memory, and
wherein, when the low-power-consumption start is selected, internal power supply to the CPU and the clock control circuit is stopped.

2. The semiconductor device according to claim 1,
wherein, when the normal start is selected, the power supply control circuit increases a driving capability or increases a self-consumption power,
wherein, when the normal startup is selected, the clock control circuit increases a clock frequency or decreases a clock division ratio,
wherein, when the low-power-consumption start is selected, the power supply control circuit decreases the driving capability or decreases the self-consumption power is small, and
wherein, when the low-power-consumption start is selected, the clock control circuit decreases the clock frequency or increases the clock division ratio.

3. The semiconductor device according to claim 1, wherein, when the normal start is selected, the substrate bias control circuit generates the substrate bias voltage after the CPU executes instructions stored in the non-volatile memory, and changes the substrate bias voltage after the substrate bias voltage is generated.

4. The semiconductor device according to claim 3, wherein, when the normal start is selected, the internal power is supplied to the CPU and the clock control circuit.

5. The semiconductor device according to claim 1,
wherein, when the normal start is selected, the power supply control, the clock control and the reset control are operated in parallel, and
wherein, when the low-power-consumption start is selected, the power supply control, the clock control and the reset control are operated sequentially.

6. The semiconductor device according to claim 5, wherein, when the low-power-consumption start is selected, the power supply control and the clock control are executed in a partially overlapping manner, and the clock control and the resetting control are executed in a partially overlapping manner.

7. A semiconductor system comprising:
a semiconductor device including;
an external terminal;
a determination circuit for determining a voltage of the external terminal;
a power supply control circuit;
a clock control circuit;

a CPU;
a non-volatile memory a first power supply device;
a second power supply device having a current supply capability smaller than a current supply capability of the first power supply device; and
a supply circuit configured to select one of the first power supply device and the second power supply device as a power supply of the semiconductor device, and supplying a high level or low level voltage signal to the external terminal in conjunction with selection of one of the first power supply device and the second power supply device,
wherein the semiconductor device selects one of start sequences of normal start and low power consumption start based on a determination result of the determination circuit,
wherein the circuit includes a first switch and a second switch,
wherein in response to the first switch selecting the first power supply device, the second switch supplies a high-level voltage signal to the external terminal, and
wherein in response to the first switch selecting the second power supply device, the second switch supplies a low-level voltage signal to the external terminal.

8. A semiconductor device including:
a fuse circuit;
a power supply control circuit;
a clock control circuit;
a CPU; and
a nonvolatile memory,
wherein the fuse circuit selects one of a normal start and a low-power-consumption start based on status signals of the fuse circuit,
wherein the normal start and the low-power-consumption start each includes a start sequence including a power supply control, a clock control, and a reset control,
wherein when the normal start is selected, the power supply control, the clock control, and the reset control are operated in parallel, and
wherein when the low-power-consumption start is selected, the power supply control, the clock control, and the reset control are operated sequentially such that the low-power-consumption start takes a longer period of time to complete than the normal start.

9. A semiconductor system comprising:
a semiconductor device including;
an external terminal;
a determination circuit for determining a voltage of the external terminal;
a power supply control circuit;
a clock control circuit;
a CPU;
a non-volatile memory;
a first power supply device;
a second power supply device having a current supply capability smaller than a current supply capability of the first power supply device; and
a supply circuit configured to select one of the first power supply device and the second power supply device as a power supply of the semiconductor device, and supplying a high level or low level voltage signal to the external terminal in conjunction with selection of one of the first power supply device and the second power supply device,
wherein the semiconductor device selects one of start sequences of normal start and low power consumption start based on a determination result of the determination circuit,
wherein the circuit includes a switch control circuit and a switch,
wherein in response to the switch control circuit selects the first power supply device, the switch control circuit supplies a high-level voltage signal to the external terminal, and the switch control circuit controls the switch to connect the first power supply device to a power supply of the semiconductor device, and
wherein in response to the switch control circuit selects the second power supply device, the switch control circuit supplies a low-level voltage signal to the external terminal, and the switch control circuit controls the switch to connect the second power supply device to a power supply of the semiconductor device.

10. A semiconductor system comprising:
a semiconductor device including;
an external terminal;
a determination circuit for determining a voltage of the external terminal;
a power supply control circuit;
a clock control circuit;
a CPU;
a non-volatile memory;
a first power supply device;
a second power supply device having a current supply capability smaller than a current supply capability of the first power supply device; and
a supply circuit configured to select one of the first power supply device and the second power supply device as a power supply of the semiconductor device, and supplying a high level or low level voltage signal to the external terminal in conjunction with selection of one of the first power supply device and the second power supply device,
wherein the semiconductor device selects one of start sequences of normal start and low power consumption start based on a determination result of the determination circuit,
wherein the circuit includes a detection circuit for detecting a voltage of a power supply generated by the first power supply device,
wherein, when the first power supply device generates a power source, the detection circuit supplies a power source generated by the first power supply device to the semiconductor device and supplies a high-level voltage signal to the external terminal, and
wherein, when the first power supply device does not generate a power source, the detection circuit supplies a power source generated by the second power supply device to the semiconductor device and supplies a low-level voltage signal to the external terminal.

* * * * *